US010803219B1

(12) United States Patent
Ziv et al.

(10) Patent No.: US 10,803,219 B1
(45) Date of Patent: Oct. 13, 2020

(54) METHOD AND SYSTEM FOR COMBINED FORMAL STATIC ANALYSIS OF A DESIGN CODE

(71) Applicant: Cadence Design Systems, Inc., San Jose, CA (US)

(72) Inventors: Maayan Ziv, Haifa (IL); Hanna Nizar, Karmiel (IL); Kanwar Pal Singh, Noida (IN); Sudeep Kumar Srivastava, Noida (IN)

(73) Assignee: Cadence Design Systems, Inc., San Jose, CA (US)

( * ) Notice: Subject to any disclaimer, the term of this patent is extended or adjusted under 35 U.S.C. 154(b) by 0 days.

(21) Appl. No.: 16/361,702

(22) Filed: Mar. 22, 2019

(51) Int. Cl.
*G06F 30/33* (2020.01)
*G06F 9/54* (2006.01)
*G06F 30/3323* (2020.01)

(52) U.S. Cl.
CPC .......... *G06F 30/3323* (2020.01); *G06F 9/542* (2013.01)

(58) Field of Classification Search
CPC .............................. G06F 9/542; G06F 30/3323
USPC ................................................. 716/101, 106
See application file for complete search history.

(56) References Cited

U.S. PATENT DOCUMENTS

| | | | |
|---|---|---|---|
| 6,378,087 B1* | 4/2002 | Flanagan et al. ... | G06F 11/3672 714/38.1 |
| 6,536,019 B1* | 3/2003 | Ouyang ................. | G06F 30/33 716/136 |
| 7,392,492 B2* | 6/2008 | Hong et al. ......... | G06F 30/3323 716/103 |
| 7,962,890 B2* | 6/2011 | Kratschmer et al. ....... G09B 19/0053 715/707 | |
| 9,032,339 B2* | 5/2015 | De et al. ............. | G06F 30/3323 716/52 |

OTHER PUBLICATIONS

Gorlick et al.,"Gauge: Its Philosophy and Design (UNC)", May 1989, The Aerospace Corporation, Research Report, one set.*
Sutherland et al., "Synthesizing System Verilog Busting the Myth that System Verilog is only for Verification", 2013, SNUG Silicon Valley, Synopsys, Paper, pp. 1-45.*

\* cited by examiner

*Primary Examiner* — Sun J Lin
(74) *Attorney, Agent, or Firm* — Pearl Cohen Zedek Latzer Baratz LLP

(57) ABSTRACT

A method for a combined formal static analysis of a design code, the method comprising using a lint checker performing Lint checks to identify a suspected violation in the design code; using a formal static analyzer, performing formal checks to identify a suspected property that corresponds to the suspected violation; applying a formal proof technique to determine whether the suspected property is proven or disproved; and if the suspected property is disproved, issuing an alert.

20 Claims, 6 Drawing Sheets

400

502

400

METHOD AND SYSTEM FOR COMBINED FORMAL STATIC ANALYSIS OF A DESIGN CODE

FIELD OF THE INVENTION

The present invention relates to verification and more particularly to method and system for a combined formal static analysis of a design code.

BACKGROUND OF THE INVENTION

Design verification is a common process for testing a newly designed integrated circuit, board, or system-level architecture (commonly referred to as Design Under Test), to, for example, confirm that it complies with the requirements defined by the specification of the architecture for that design.

Formal verification relates to various techniques that employ static analysis to, for example, determine the correctness of hardware or software.

Typically, formal verification seeks to provide a formal proof of a mathematical model of the design under test. The mathematical model typically corresponds to the designed under test. Formal verification may be performed in various levels of the design to be verified and is aimed at the functional aspects of the design.

Lint checks (sometimes referred to as "Pre-Layout Design Rule Checking—PLDRC) are typically performed on register-transfer level (RTL). RTL lint typically refers to a design and/or coding checker. An RTL lint checker typically checks Hardware Description Language (HDL) code, such as VHDL, Verilog etc., to determine whether the code is synthesizable, and whether it is suitable for simulation, testing, etc. Lint checks typically apply a large set of rules designed to investigate the code to be verified and find structural violations.

SUMMARY OF THE INVENTION

There is thus provided, according to some embodiments of the present invention, a method for a combined formal static analysis of a design code. The method includes using a processor, applying a lint checker to perform Lint checks to identify a suspected violation in the design code. The method also includes applying a formal static analyzer, to perform formal checks to identify a suspected property that corresponds to the suspected violation. The method also includes applying a formal proof technique to determine whether the suspected property is proven or disproved; and if the suspected property is disproved, issuing an alert.

According to some embodiments of the present invention, if the suspected property is proven, the method further includes discarding the suspected violation, or issuing a reduced risk alert relating to the suspected violation or the suspected property.

According to some embodiments of the present invention, the alert relates to the suspected violation.

According to some embodiments of the present invention, the alert relates to the suspected property.

According to some embodiments of the present invention, the alert is a visual alert.

According to some embodiments of the present invention, the visual alert is selected from a group of alert forms consisting of: highlighting, underlining, blinking, and coloring.

According to some embodiments of the present invention, the method further includes issuing an audio alert.

According to some embodiments of the present invention, there is provided, a non-transitory computer readable storage medium a combined formal static analysis of a design code, having stored thereon instructions that when executed by a processor will cause the processor to: perform Lint checks to identify a suspected violation in the design code; perform formal checks to identify a suspected property that corresponds to the suspected violation; apply a formal proof technique to determine whether the suspected property is proven or disproved; and if the suspected property is disproved, issue an alert.

According to some embodiments of the present invention, there is also provided a system for a combined formal static analysis of a design code. The system includes a memory and a processor configured to: perform Lint checks to identify a suspected violation in the design code; perform formal checks to identify a suspected property that corresponds to the suspected violation; apply a formal proof technique to determine whether the suspected property is proven or disproved; and if the suspected property is disproved, issue an alert.

BRIEF DESCRIPTION OF THE DRAWINGS

In order the present invention to be better understood, and its practical applications appreciated, the following figures are provided and referenced hereafter. It should be noted that the figures are given as examples only and in no way limit the scope of the invention Like components are denoted by like reference numerals.

DETAILED DESCRIPTION OF EMBODIMENTS OF THE INVENTION

Figure 1:
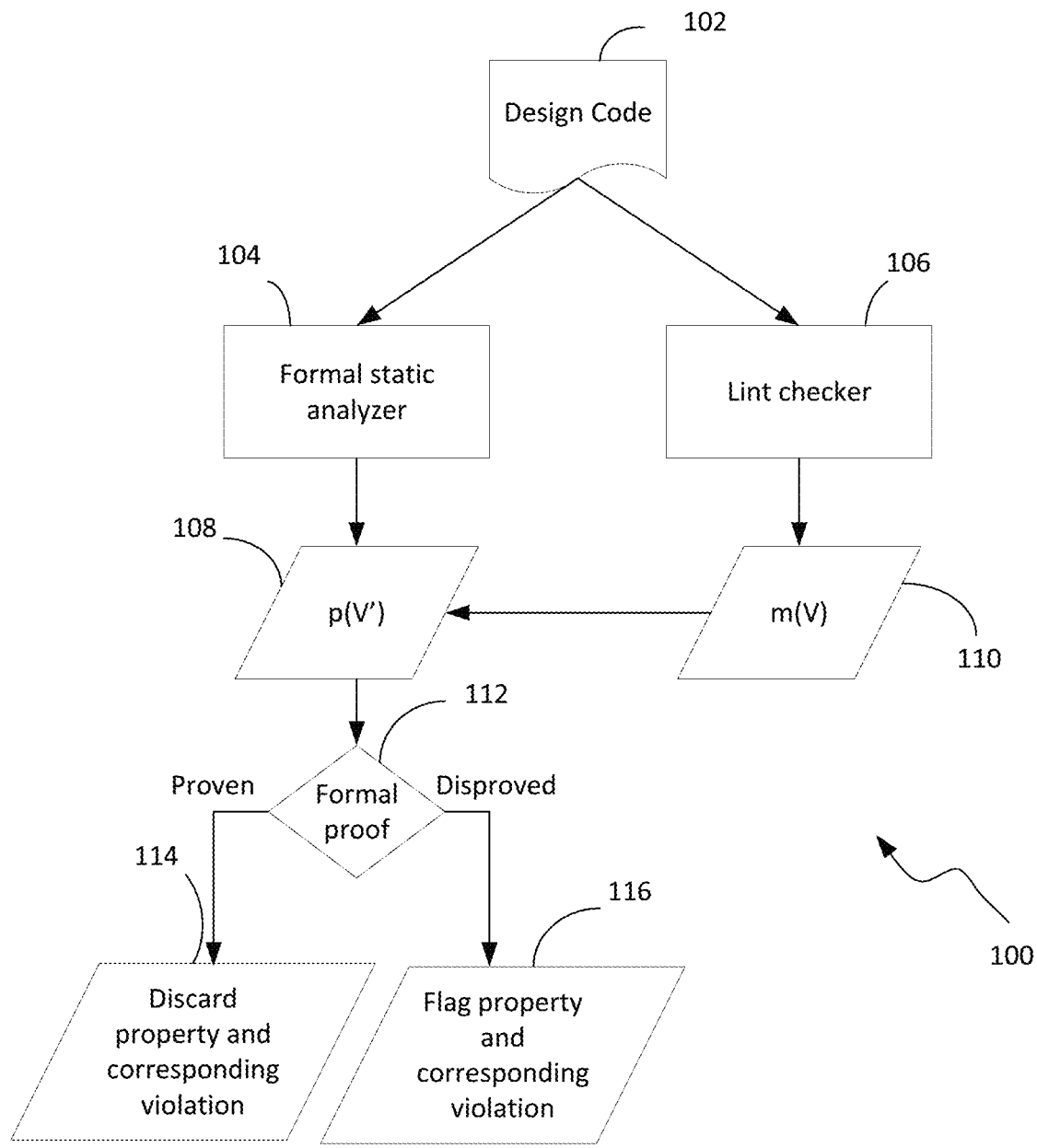
FIG. 1 is a schematic drawing of a combined static analysis tool employing Lint checks and formal checks, according to some embodiments of the present invention.

In the following detailed description, numerous specific details are set forth in order to provide a thorough understanding of the methods and systems. However, it will be understood by those skilled in the art that the present methods and systems may be practiced without these specific details. In other instances, well-known methods, procedures, and components have not been described in detail so as not to obscure the present methods and systems.

Although the examples disclosed and discussed herein are not limited in this regard, the terms "plurality" and "a plurality" as used herein may include, for example, "multiple" or "two or more". The terms "plurality" or "a plurality" may be used throughout the specification to describe two or more components, devices, elements, units, parameters, or the like. Unless explicitly stated, the method examples described herein are not constrained to a particular order or sequence. Additionally, some of the described method examples or elements thereof can occur or be performed at the same point in time.

Unless specifically stated otherwise, as apparent from the following discussions, it is appreciated that throughout the specification, discussions utilizing terms such as "adding", "associating" "selecting," "evaluating," "processing," "computing," "calculating," "determining," "designating," "allocating" or the like, refer to the actions and/or processes of a computer, computer processor or computing system, or similar electronic computing device, that manipulate, execute and/or transform data represented as physical, such as electronic, quantities within the computing system's registers and/or memories into other data similarly represented as physical quantities within the computing system's memories, registers or other such information storage, transmission or display devices.

An electronic system (e.g., a smartphone) may typically be made up of a plurality of electronic devices (e.g., memory, camera, central processing unit—CPU, graphical processing unit-GPU, microphone, media player, etc.).

Formal verification can employ a variety of static analysis techniques based on mathematical transformations, that can be aimed at determining the correctness of hardware/software (hereinafter—design) anticipated performance, as opposed to, for example, dynamic verification techniques that test the hardware/software by executing various tests on the design to be verified.

A Lint tool can parse and check a source code of a design to, for example, determine syntactical correctness of the code, to find violations. Such violations may be, for example, indexing beyond array bounds, dereferencing of null pointers, suspicious assignments, mismatch in variable types, unused variable, unreachable code parts, etc.

Many debugging professionals consider lint check to be too "noisy", as a Lint checker tends to generate large number of alerts, many of which, after human inspection, are discarded. One reason for the many instances of violations that are later cleared is typically because in many instances what appears in the Lint checks as a suspected structural error and flagged as a violation is valid and there on purpose and not a mistake. A Lint checker is typically aimed at checking the structure and is very sensitive to suspected structural errors, flagging them as violations (these violations typically appear in the form of a text message).

When performing formal static analysis (hereinafter "formal checks"), a formal analysis tool can be aimed at the functional aspects of the design and/or typically identifies properties (e.g., assertion, coverage) suspected as violations. The formal analysis tool may apply a formal proof method to prove each of the suspected properties. Typically, if proven, a property is not flagged as a violation, but if not proven—it is flagged as a violation. If the suspected property is disproved the combined static analysis tool may automatically issue an alert.

Lint tools typically conduct static or structural analysis over the RTL code and generate the checks, that point out suspected issues/bugs in the code. However, Lint tools do not deal with functionally and the debugging professional has to debug and decide whether the generated check indicates a bug or constitutes a false alert. Typically, a big problem with any Lint tool is the amount of checks reported back to the debugging professional, who in turn needs to spend precious time to analyze and debug those checks. Noisy checks can cause damage to the tool perception and hinder user experience and efficiency, and users may waste time spent to analyze those noisy checks, thus costing additional money in manpower.

According to some embodiments of the present invention a formal analysis is suggested in order to reduce noise in lint checks. Formal checks may be used to either strengthen a suspected violation lint check or clear the suspected violation, and thus eliminate or greatly reduce noise in lint checks.

By taking into consideration both lint checks and corresponding formal checks, according to some embodiments of the present invention, the formal verification process of design codes may be enhanced, reducing unnecessary alerts and reducing human labor, and increasing the efficiency of the formal verification process.

FIG. 1 is a schematic drawing of a combined static analysis tool 100 employing Lint checks and formal checks, according to some embodiments of the present invention. The combined static analysis tool 100 may include a Lint checker 106 and a formal static analyzer 104. A design code 102 may be fed to the Lint checker 106 and the formal static analyzer 104. The Lint checker is configured to perform Lint checks of design code 102 and output a list of suspected violations, which may be printed into a log file m(V) 110. The formal static analyzer 104 is configured to perform formal static analysis on design code 102 and output a list of suspected properties (e.g., uninitialized variables, nil-pointer dereferencing, out-of-bound array of indexing, user-defined properties, etc.), for example, in the form of a list of suspected properties, which may be printed into a log file p(V') 108. The formal static analyzer 104 may then proceed to formally try to prove or disprove 112 each of the suspected properties. According to some embodiments of the invention a correlation between a suspected violation resulting from the Lint checks and a property of the output properties from the formal static analyzer may be established, for example by using static mapping between lint checks and related formal checks. If that property is proven, then the combined static analysis tool may automatically discard the suspected property and corresponding violation that was found in by the Lint checker. If the property is disproved, then the suspected violation identified by the Lint checker may be identified as an issue to be addressed by the user.

According to some embodiments of the present invention, if the suspected property identified by the formal check was proven the corresponding suspected violation identified by the lint check may be automatically considered as a false alert or at least be entitled to be considered to as a "reduced risk" and indicated as such, e.g., visually, on a user interface (UI) to be displayed on a display device, so that the user may disregard it and direct attention to other flagged checks. If the formal check was disproved, then the corresponding lint check may be considered as an "increased risk" and indicated as such, for example visually on the UI, to encourage the user to look into the flagged violation.

In some embodiments of the present invention, if proven the property may be visually marked (e.g., by highlighting, underlining, blinking, coloring, for example in green, etc.) so as to indicate the suspected violation or the suspected property as "safe" or "reduced suspicion", and if the suspected property is not proven—the suspected violation or the suspected property may be visually marked (e.g., by highlighting, underlining, blinking, coloring, for example in red, etc.) so as to indicate the suspected violation as "unsafe" or "raised suspicion".

In some embodiments of the invention, If the property identified by the formal check was proven the corresponding suspected violation may be automatically considered as a false alert or at least be considered as a "reduced risk" and ignored (e.g., not issue any report or other violation indication). If the suspected property was disproved, then the corresponding suspected violation may be considered as an "increased risk" and flagged.

In some embodiments, if the formal check was disproved, then the combined formal static analyzer may issue an alert relating to the suspected property. This may be a good choice as the nature of the fault identified by the formal static analyzer relates to a functionality issue, whereas the suspected violation identified by the Lint checker relates to a structural issue.

The alerts, according to some embodiments of the invention may include visual marking, coloring, underlining, using bold font, etc., with or without an audio alerts, such as a sound. In some embodiments the sound alerts may include a plurality of different sounds, each associated with a kind of fault from a plurality of different kinds of faults.

Below is an example of a code excerpt which appears to include a combinational loop:

```
logic [3:0] gen_loop, gen_loop_in, gen_loop_in2;
genvar i;
generate
   for (i=0; i<4; i=i+1) begin
      assign gen_loop (i)=sel ? gen_loop_in2 (i): (!sel ?
         gen_loop_in2 (i):
         ((gen_loop_in2 (i)^(gen_loop_in (i)+gen_loop (i)))));
   end
endgenerate
```

Figure 2:
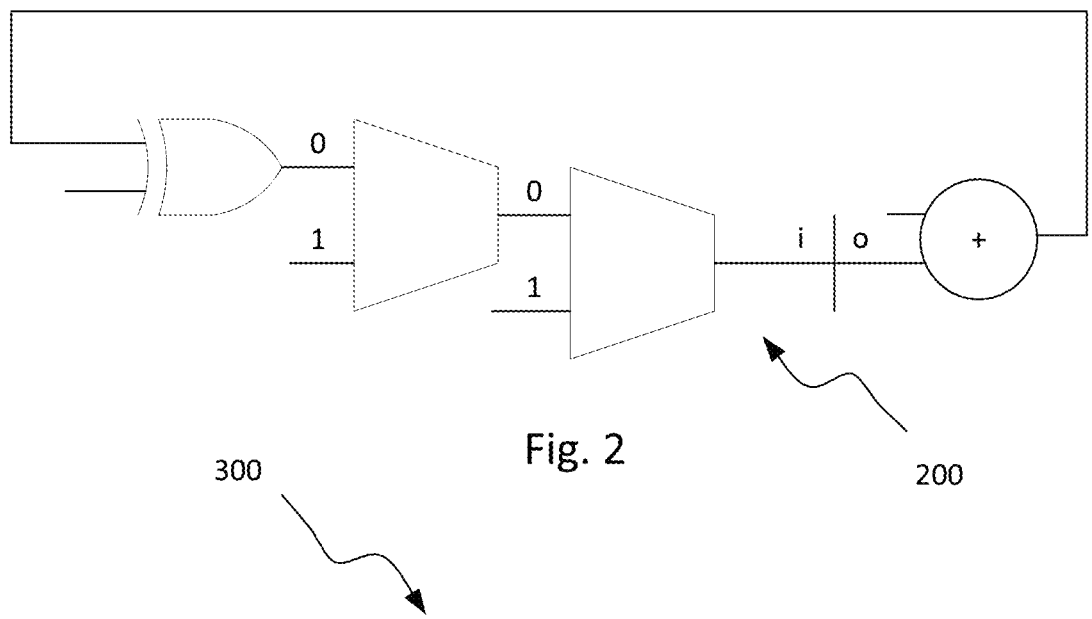
FIG. 2 is a schematic illustration of the combinational loop which may be identified as a violation by a Lint checker of a combined formal static analyzer, according to some embodiments of the present invention.

FIG. 2 is a schematic illustration of the combinational loop 200 which may be identified as a violation by a Lint checker of a combined formal static analyzer, according to some embodiments of the present invention. Combinational loops are logical structures that contain no synchronous feedback element and may cause stability and reliability problems.

While commonly a combinational loop is considered undesired, there are situations where a combinational loop is intentional and required for the good performance of a design.

Thus, a lint checker is typically bound to flag a combinational loop. With a combined formal static analyzer, according to some embodiments of the present invention, the formal static analyzer may determine that functionally there is no combinational loop, or that this combinational loop is functionally valid, by proving it, causing the combined formal static analyzer, according to some embodiments, to refrain from flagging the combinational loop as a violation, or indicate it as a "reduced risk".

Figure 3:
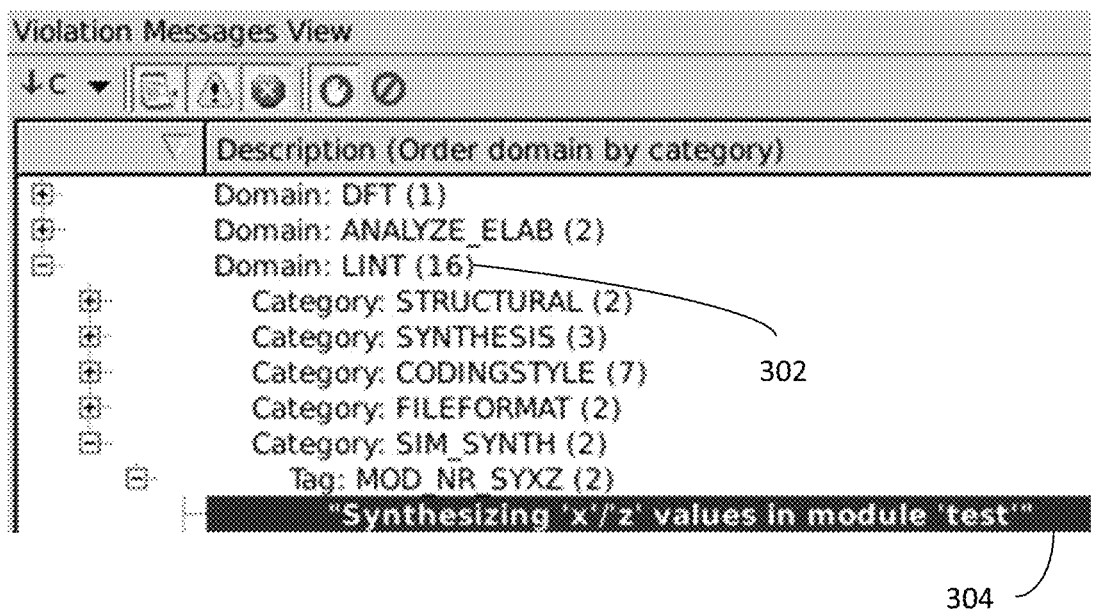
FIG. 3 is a GUI showing examples of violation message that were generated by a Lint checker of a combined formal static analyzer, according to some embodiments of the present invention.

FIG. 3 is a screenshot of a GUI showing examples of violation message that were generated by a Lint checker of a combined formal static analyzer, according to some embodiments of the present invention. For example a list of Lint checker messages is presented below line 302 titled "Doman: Lint (16)", where, for example, 16 is the total number of Lint check messages, as there are two (2) structural messages, three (3) synthesis messages, seven (7) coding style messages, two (2) file format messages, and two (2) simulation synthesized (SIM-SYNTH) messages— all adding up to sixteen (16). Below the SIM-SYNTH heading, a message warning of an X assignment is shown, stating "Synthesizing 'x'/'z' values in module 'test'".

Figure 4:
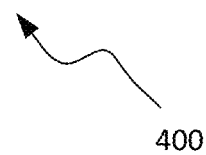
FIG. 4 is a screenshot of a GUI showing a property alert that was generated by the formal static analyzer of a combined formal static analyzer, according to some embodiments of the present invention.

FIG. 4 is a screenshot of a GUI designed to present a list of formal property alerts 400, showing a property alert that was generated by the formal static analyzer of a combined formal static analyzer, according to some embodiments of the present invention. Specifically, in this example, the alert ("x_assignment_prop_5") corresponds to the same issue that was flagged by the message 304 of the Lint checker (FIG. 3).

Figure 5:
FIG. 5 is a screenshot of the GUI designed to present a list of formal property alerts 400 of FIG. 4, indicating that the property alerted was proven by the formal static analyzer of the combined formal static analyzer, according to some embodiments of the present invention.

FIG. 5 is a screenshot of the GUI designed to present a list of formal property alerts 400 of FIG. 4. In this screenshot the property alert that was generated by the formal static analyzer of a combined formal static analyzer, according to some embodiments of the present invention, is marked as "proven" (checked box 502).

Figure 6:
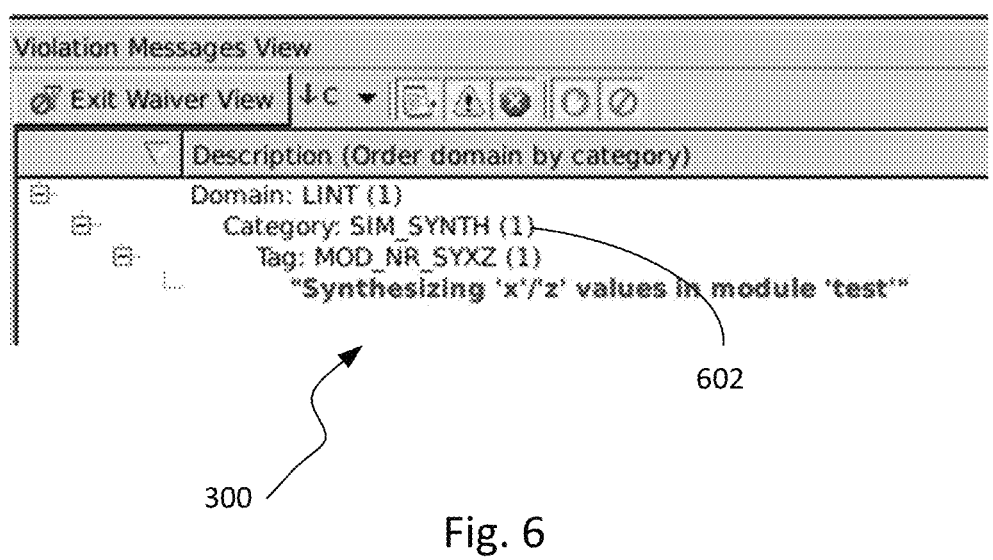
FIG. 6 is a screenshot of the GUI of FIG. 4, after the alert corresponding to the assignment of X was discarded, according to some embodiments of the present invention.

FIG. 6 is a screenshot of the GUI of FIG. 4, after the alert corresponding to the assignment of X was discarded (deleted), leaving only one (1) SIM_SYNTH violation alert 602. The alert on the X assignment was automatically discarded by the combined formal static analyzer, according to some embodiments of the present invention, because the corresponding property, that was initially detected as a suspected violation was proven by the formal static analyzer of the combined formal static analyzer.

Figure 7:
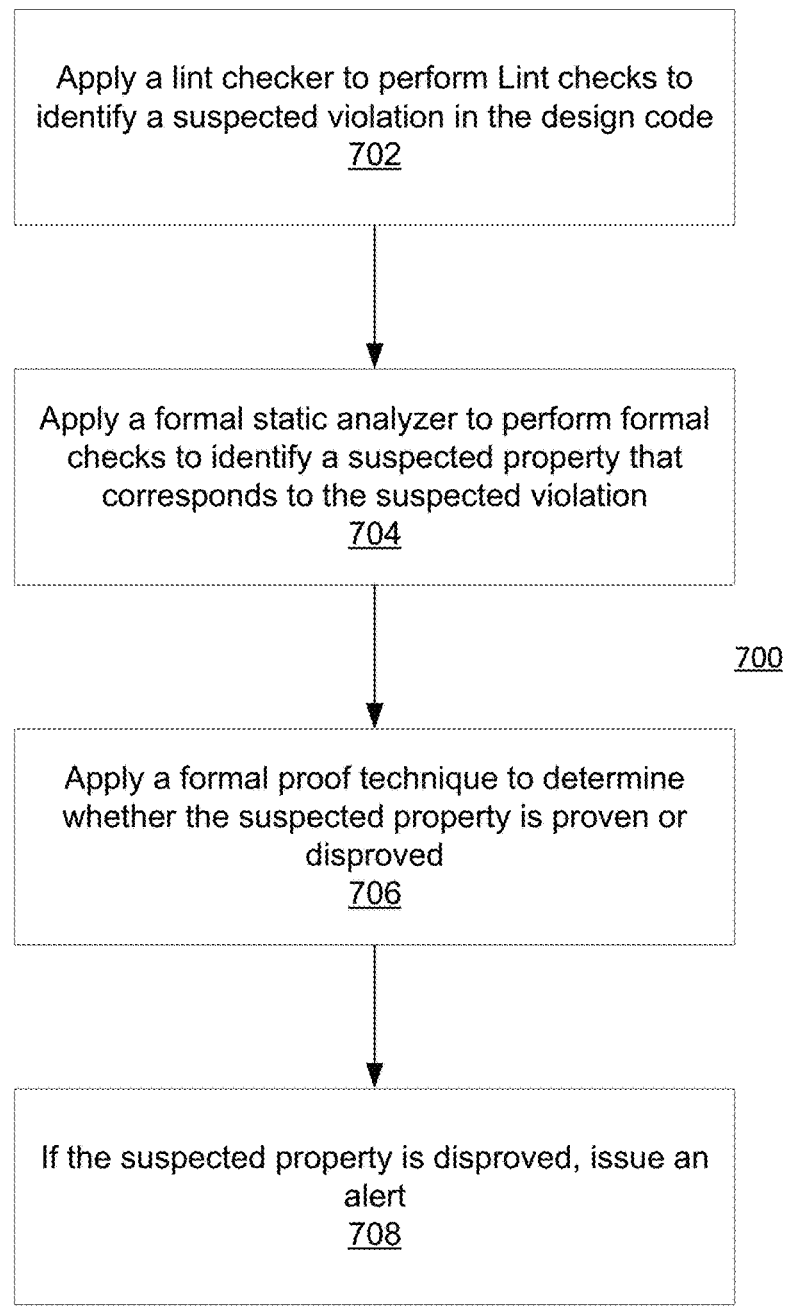
FIG. 7 is a schematic chart of a method for combined formal static analysis of a design, according to some embodiments of the present invention.

FIG. 7 is a schematic chart of a method 700 for combined formal static analysis of a design, according to some embodiments of the present invention.

Method 700 may include using a processor, applying a lint checker to perform Lint checks 702 to identify a suspected violation in the design code. Method 700 may also include applying a formal static analyzer to perform formal checks 704 to identify a suspected property that corresponds to the suspected violation. Method 700 may also include applying 706 a formal proof technique to determine whether the suspected property is proven or disproved; and if the suspected property is disproved, issuing 708 an alert.

In some embodiments the method may further include, if the suspected property is proven, discarding the suspected violation, or issuing a reduced risk alert relating to the suspected violation or the suspected property.

In some embodiments, the alert may relate to the suspected violation.

In some embodiments, the alert relates to the suspected property.

In some embodiments, the alert is a visual alert.

In some embodiments, the visual alert is selected from a group of alert forms consisting of: highlighting, underlining, blinking, and coloring.

In some embodiments, the method may also include issuing an audio alert.

Figure 8:
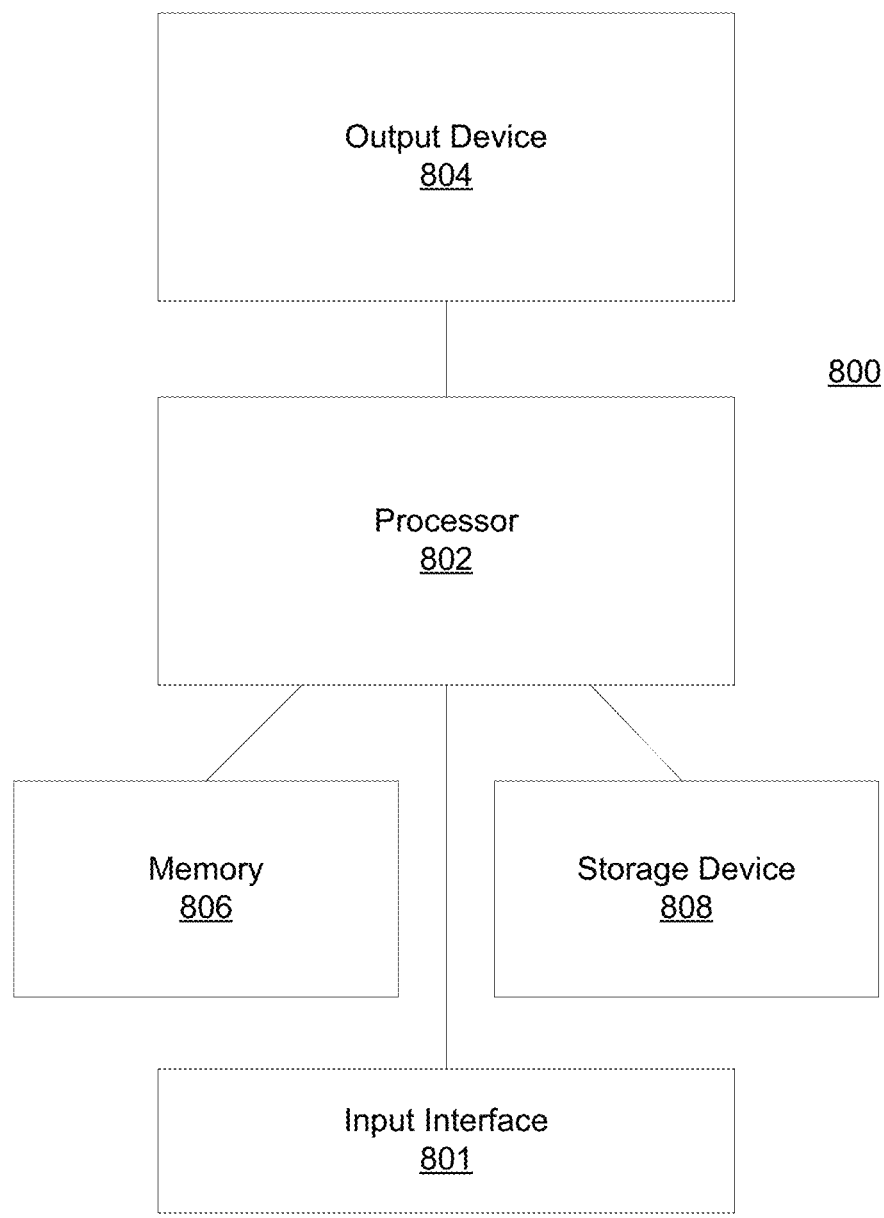
FIG. 8 is a system for reconstructing a graph representation of a previously executed verification test, according to some embodiments of the present invention.

FIG. 8 is a system 800 for combined formal static analysis of a design, according to some embodiments of the present invention. System 800 may include a processor 802 (e.g. single processor or a processing unit made that includes a plurality of processors, on a single machine or distributed on a plurality of machines) for executing a method according to some embodiments of the present invention. Processing unit 802 may be configured to perform Lint checks to identify a suspected violation in the design code; to perform formal checks to identify a suspected property that corresponds to the suspected violation; to apply a formal proof technique to determine whether the suspected property is proven or disproved; and if the suspected property is disproved, to issue an alert, and to perform other actions and processing according to some embodiments of the present invention.

Processor 802 may be linked with memory 806 on which a program implementing a method according to some embodiments of the present invention and corresponding data may be loaded and run from, and storage device 808, which includes a non-transitory computer readable medium (or mediums) such as, for example, one or a plurality of hard disks, flash memory devices, etc. on which a program implementing a method according to some embodiments of the present invention and corresponding data may be stored. System 800 may further include an output device 804 (e.g. display device such as CRT, LCD, LED etc.) on which one or a plurality user interfaces associated with a program implementing a method according to some embodiments of the present invention and corresponding data may be presented. System 800 may also include input interface 801, such as, for example, one or a plurality of keyboards, pointing devices, touch sensitive surfaces (e.g. touch sensitive screens), etc. for allowing a user to input commands and data.

Some embodiments of the present invention may be embodied in the form of a system, a method or a computer program product. Similarly, some embodiments may be embodied as hardware, software or a combination of both. Some embodiments may be embodied as a computer program product saved on one or more non-transitory computer readable medium (or media) in the form of computer readable program code embodied thereon. Such non-transitory computer readable medium may include instructions that when executed cause a processor to execute method steps in accordance with examples. In some examples the instructions stores on the computer readable medium may be in the form of an installed application and in the form of an installation package.

Such instructions may be, for example, loaded by one or more processors and get executed.

For example, the computer readable medium may be a non-transitory computer readable storage medium. A non-transitory computer readable storage medium may be, for example, an electronic, optical, magnetic, electromagnetic, infrared, or semiconductor system, apparatus, or device, or any combination thereof.

Computer program code may be written in any suitable programming language. The program code may execute on a single computer system, or on a plurality of computer systems.

Some embodiments are described hereinabove with reference to flowcharts and/or block diagrams depicting methods, systems and computer program products according to various embodiments.

Features of various embodiments discussed herein may be used with other embodiments discussed herein. The foregoing description of the embodiments has been presented for the purposes of illustration and description. It is not intended to be exhaustive or limiting to the precise form disclosed. It should be appreciated by persons skilled in the art that many modifications, variations, substitutions, changes, and equivalents are possible in light of the above teaching. It is, therefore, to be understood that the appended claims are intended to cover all such modifications and changes that fall within the true spirit of the present invention.

The invention claimed is:

1. A computerized method for a combined formal static analysis of a design code, the method comprising:
   using a processor
   applying a lint checker to perform Lint checks to identify a suspected violation in the design code;
   applying a formal static analyzer to perform formal checks to identify a suspected property that corresponds to the suspected violation;
   applying a formal proof technique to determine whether the suspected property is proven or disproved; and
   if the suspected property is disproved, issuing an alert.

2. The method of claim 1, further comprising, if the suspected property is proven, discarding the suspected violation, or issuing a reduced risk alert relating to the suspected violation or the suspected property.

3. The method of claim 1, wherein the alert relates to the suspected violation.

4. The method of claim 1, wherein the alert relates to the suspected property.

5. The method of claim 1, wherein the alert is a visual alert.

6. The method of claim 5, wherein the visual alert is selected from a group of alert forms consisting of: highlighting, underlining, blinking, and coloring.

7. The method of claim 5, further comprising issuing an audio alert.

8. A non-transitory computer readable storage medium, for use in a combined formal static analysis of a design code, having stored thereon instructions that, when executed by a processor, cause the processor to:
   perform Lint checks to identify a suspected violation in the design code;
   perform formal checks to identify a suspected property that corresponds to the suspected violation;
   apply a formal proof technique to determine whether the suspected property is proven or disproved; and
   if the suspected property is disproved, issue an alert.

9. The non-transitory computer readable storage medium of claim 8, wherein, if the suspected property is proven, to discard the suspected violation, or issue a reduced risk alert relating to the suspected violation or the suspected property.

10. The non-transitory computer readable storage medium of claim 8, wherein the alert relates to the suspected violation.

11. The non-transitory computer readable storage medium of claim 8, wherein the alert relates to the suspected property.

12. The non-transitory computer readable storage medium of claim 8, wherein the alert is a visual alert.

13. The non-transitory computer readable storage medium of claim 12, wherein the visual alert is selected from a group of alert forms consisting of: highlighting, underlining, blinking, and coloring.

14. The non-transitory computer readable storage medium of claim 12, wherein the alert includes an audio alert.

15. A system for a combined formal static analysis of a design code, the system comprising:
   a memory and
   a processor configured to:
   perform Lint checks to identify a suspected violation in the design code;
   perform formal checks to identify a suspected property that corresponds to the suspected violation;
   apply a formal proof technique to determine whether the suspected property is proven or disproved; and
   if the suspected property is disproved, issue an alert.

16. The system of claim 15, wherein the processor is further configured, if the suspected property is proven, to discard the suspected violation, or issue a reduced risk alert relating to the suspected violation or the suspected property.

17. The system of claim 15, wherein the alert relates to the suspected violation.

18. The system of claim 15, wherein the alert relates to the suspected property.

19. The system of claim 15, wherein the alert is a visual alert.

20. The system of claim 19, wherein the visual alert is selected from a group of alert forms consisting of: highlighting, underlining, blinking, and coloring.

* * * * *